United States Patent [19]

Lopez et al.

[11] Patent Number: 5,132,647
[45] Date of Patent: Jul. 21, 1992

[54] BAND PASS AND ELIMINATION FILTER NETWORK FOR ELECTRIC SIGNALS WITH INPUTS SYMMETRIC TO A SPECIFIC REFERENCE LEVEL

[76] Inventors: Ricardo R. Lopez, Residencial Las Lagunas, Bloque 5-10B, Mijas Costa (Málaga); Jose L. C. Garcia, Santa Rosa No. 3, Urbanización Sierra, Mijas, Torre 12-8-A, Fuengirola (Málaga); Emilio D. Follente, Prolongación Miguel Bueno, Edificio, Dna Lucia, Portal 2-30B, Fuengirola (Málaga), all of Spain

[21] Appl. No.: 595,478

[22] Filed: Oct. 11, 1990

[30] Foreign Application Priority Data

Jun. 6, 1990 [ES] Spain .................................. 9001559

[51] Int. Cl.$^5$ ............................................. H03H 7/01
[52] U.S. Cl. ...................................... 333/175; 333/25; 333/177
[58] Field of Search ............... 333/117, 1, 119, 25, 333/177–180, 175, 176; 455/284, 286, 339

[56] References Cited

U.S. PATENT DOCUMENTS

| | | | |
|---|---|---|---|
| 2,274,124 | 2/1942 | Bowley | 333/178 X |
| 3,325,753 | 6/1967 | Shearer et al. | 333/177 X |
| 3,329,884 | 7/1967 | Gewartowski | 333/117 X |
| 3,671,889 | 6/1972 | Favors | 333/177 |
| 4,003,005 | 1/1977 | Mukherjee et al. | 333/177 X |
| 4,240,052 | 12/1980 | Hallford et al. | 333/202 |
| 4,395,688 | 7/1983 | Sellers | 333/178 X |
| 4,599,587 | 7/1986 | Hartmann et al. | 333/177 X |

FOREIGN PATENT DOCUMENTS 1280353 10/1968 Fed. Rep. of Germany.

Primary Examiner—Eugene R. LaRoche
Assistant Examiner—Seung Ham
Attorney, Agent, or Firm—Foley & Lardner

[57] ABSTRACT

A bandpass and/or elimination filter network for electric signals, includes an input circuit (1) which has the capacity to symmetrize and adapt the input impedance, and two branches (B C) and (D E) to which two frequency dependent cells (L C) are introduced. The branches meet at a combination circuit (2) for convergence to the sole output. This network can be used in communications electronics applications.

19 Claims, 8 Drawing Sheets

BAND PASS AND ELIMINATION FILTER NETWORK FOR ELECTRIC SIGNALS WITH INPUTS SYMMETRIC TO A SPECIFIC REFERENCE LEVEL

BACKGROUND OF THE INVENTION

This invention refers to a band pass and/or elimination network for electric signals, with a high level of efficiency in the selectivity and adjustment processes. This selectivity capacity would only normally be present in considerably more complex devices which complicate the realisation and adjustment processes.

Therefore, this invention improves, and, at the same time, simplifys the filtering process, when compared to other devices which obtain the same results with respect to frequency response.

The invention also refers to a filter network with a high level of immunity against unsuitable frequencies, both for band pass and band elimination filters, this being provided for by a counterphase effect which ensures that these unsuitable frequencies are, in theory, cancelled when they reach the filter output, there being practically no output of such frequencies. This aspect of the invention is described in more detail further on.

The frequency filter network of the invention can be used in L.F. to S.H.F. applications, although its characteristics and size make it particularly suitable for V.H.F. and U.H.F. applications.

Filter devices are currently used in all transmission, teledistribution, radio broadcasting and radio linkage systems, as in all other systems which need to select and obtain information contained in a specific frequency segment. This invention can be used in all of these systems.

In other cases, where it is necessary to process all frequencies with the exception of some or specific segments or bands, band trap or elimination filters are used. In both cases the invention is remarkably efficient, not only in selectivity, but also in affording protection or rejecting the unsuitable frequencies, whatever their strength may be.

SUMMARY OF THE INVENTION

Consequently, the aim of this invention is to produce filter devices which appropriately select and filter frequencies which are necessary at any given moment, while being able to reject frequencies which, although present at the filter inlet, are unwanted, whether are unsuitable frequencies (interference, unsuitable effects of intermodulation created by the system, etc.) or those which form part of the system but are unwanted at a particular moment (frequency multiplexed signals, etc.).

A further advantage of the system is that it affords a high level of protection against interference or unsuitable frequencies.

Further objectives and applications of the invention are apparent from the detailed description given below. However, it must be pointed out that this description and the specific examples given therein illustrate recommended methods and are provided by way of example only. Those of ordinary skill in the art will appreciate that changes or modifications can be made within the spirit and scope of the invention disclosed and claimed herein.

Before proceeding to the detailed description, it is necessary to point out that the device described in this report is based on three main effects:

Transformation effect, by which the signals present at the input of the device, which are of asymmetric impedance, are converted in such a way that they become symmetrical or balanced impedance signals.

Electromagnetic resonance effect, by which impedance present at each of the device branches is variable in accordance with the frequency.

Counterphase effect, whereby output depends on the difference in the signals running through each of the balanced branches for a specific frequency.

The transformation effect occurs by means of any device where the transformation results in two balanced branches with respect to a ground mass or zero reference.

The resonance effect occurs whenever a device(s) exhibits highly variable impedance in accordance with an applied input frequency.

The counterphase effect occurs whenever a device produces two phase reversed signals.

As indicated in the following description, these three effects are the basis of the invention and, therefore, form an integral part of it.

Any combination of these effects, taking place during a process not detailed herein but along the same lines and giving the same results, should be considered to be a further feature of the invention. Since it is only possible to include a small selection of the innumerable possibilities with regard to the method and characteristics of the invention these are, by way of example only and not by way of limitation.

BRIEF DESCRIPTION OF DRAWINGS

In order to clarify the workings of this invention, a detailed description is given below, aided by diagrams and drawings which are provided by way of example only and do not represent the entire scope of the invention.

DESCRIPTION OF THE PREFERRED EMBODIMENTS

Figure 1:
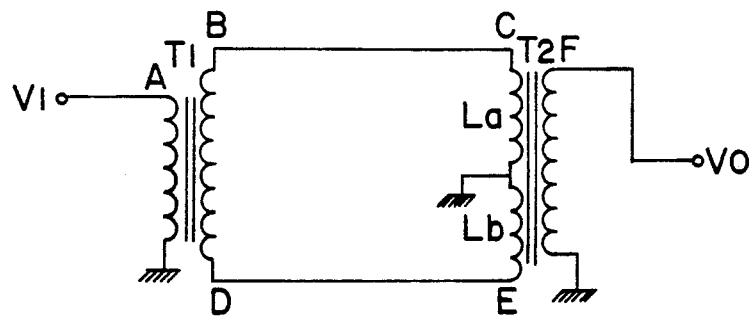
FIG. 1 shows one effect of this invention and represents a simple, balanced circuit with counterphase output.

In order to obtain a filter network with the above characteristics, in addition to detailing its operational capacities, reference is made to the diagram shown in FIG. 1. This represents a balanced circuit with counterphased output.

The V1 signal present in A stimulates the T1 transformer primary and induces the secondary of the same transformer in such a way that it actuates the La and Lb coils of the transformer T1 primary, symmetrically via the BC and DE branches. In view of the fact that coils La and Lb which make up the T2 primary, are identical and are counterphased with respect to their central point connected to ground, the T2 secondary receives the La and Lb signals in phase opposition, whereby field cancellation results, giving a null value to Vo. The cancellation effect in this case will be apparent whatever the frequency value applied at the circuit input, i.e. at A. Transformers T1 and T2 are wide band.

Figure 2:
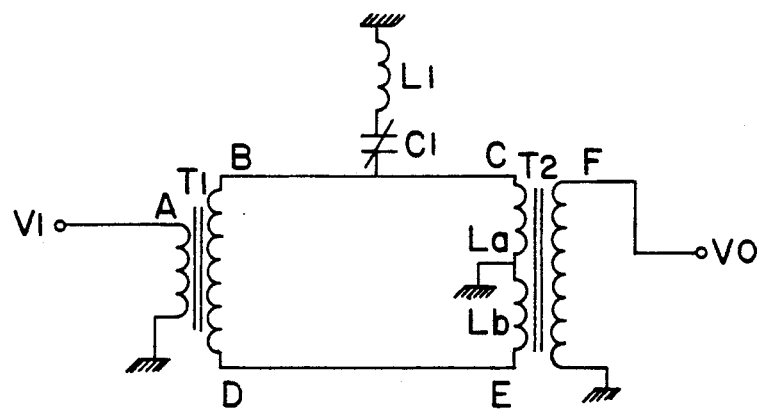
FIG. 2 shows a balanced circuit with a resonant circuit LC coupled to one of its branches; this illustrates the combination of two effects covered by this invention.

In FIG. 2, a resonant circuit LC has been coupled to one of the balanced branches B-C of the circuit, this former comprising the L1 and C1 coil. In this network the B-C branch presents a level of impedance which, in theory, has a null value with respect to ground at the resonance frequency of this network, while this frequency is not absorbed to ground by the D-E branch and presents the Lb coil impedance to this frequency. Consequently, all frequencies separated from the resonance frequency of the L1 and C1 network will be cancelled in the T2 transformer as a result of the above. However, this is not the case with a signal of the resonance frequency of the connected network since, as it is shunted to ground in the B-C branch, it cannot stimulate the corresponding coil of the transformer primary and, therefore, this resonance frequency is not cancelled due to the fact that all energy is received by the D-E branch and the Lb coil, while in the T2 secondary a signal corresponding to the L1, C1 resonance frequency and those close to it appears to a greater or lesser degree dependent on the Q value of the L1, C1 resonant circuit coupled to the B-C branch.

Although in principle it might be expected that the above mentioned circuit would work in the same way as a filter in series (LC), it actually produces an effect which results in the asymptotic gradient of the amplitude/frequency curve response moving towards zero far more quickly, due to the reaction between the coils La and Lb of the transformer T2 primary. The assembly functions as a circuit LC in parallel with a greater Q value.

When the circuit input frequency equals the resonance frequency of the L1, C1 network, the impedance apparent in the B-C branch with respect to ground is, in theory, null (ignoring the ohmic resistance of the coil L1) and the energy in the coil La of the transformer T2 primary is null, while the energy in coil Lb of the transformer T2 primary is at a maximum, giving a maximum level of Vo output. As the resonance frequency of L1, C1 is moved away, the impedance present in the B-C branch with respect to ground, increases due to the resonant circuit L1, C1 and, consequently, the energy in the La coil of the transformer T2 primary increases, while the energy in Lb decreases. Due to the fact that these two sources of energy are in phase opposition, the one present at the output, moves towards zero more quickly than that of the L1, C1 network independently. In this way, a response curve (amplitude/frequency) which moves towards zero more quickly (i.e. with a greater gradient) is observed, equivalent to obtaining a circuit with a far greater Q value by way of this method.

Figure 12:
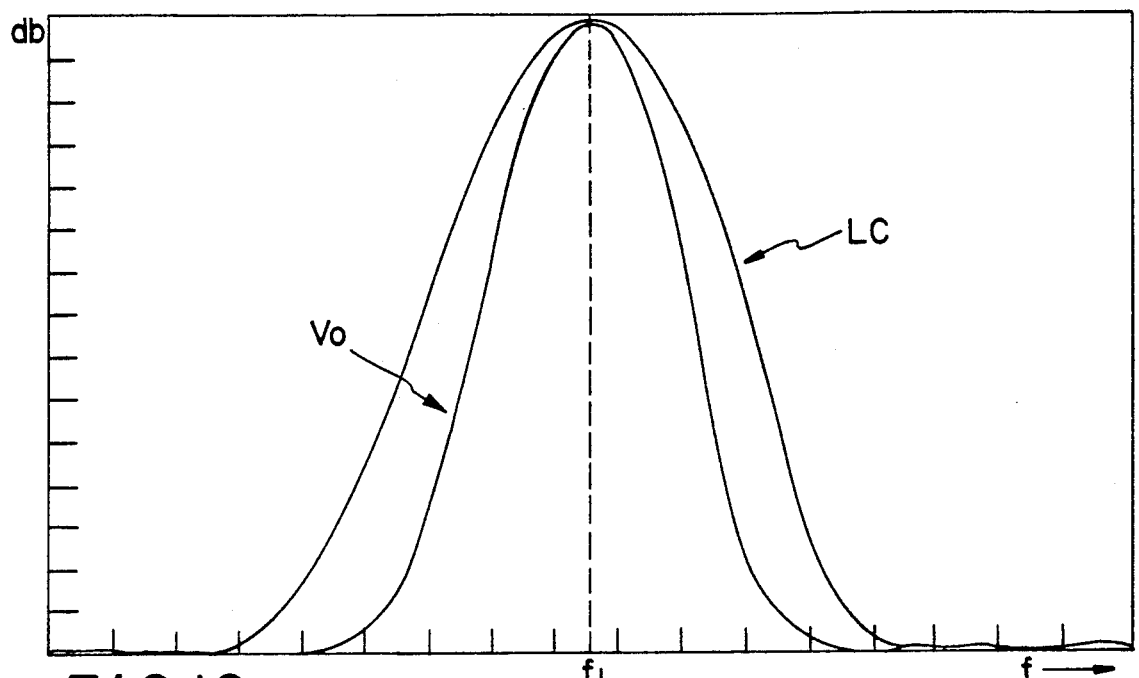
FIG. 12 shows the amplitude/frequency responses of the individual network in series (LC) which is coupled to the BC branch shown in FIG. 2, these being obtained at the Vo output due to the counterphase effect.
Figure 13:
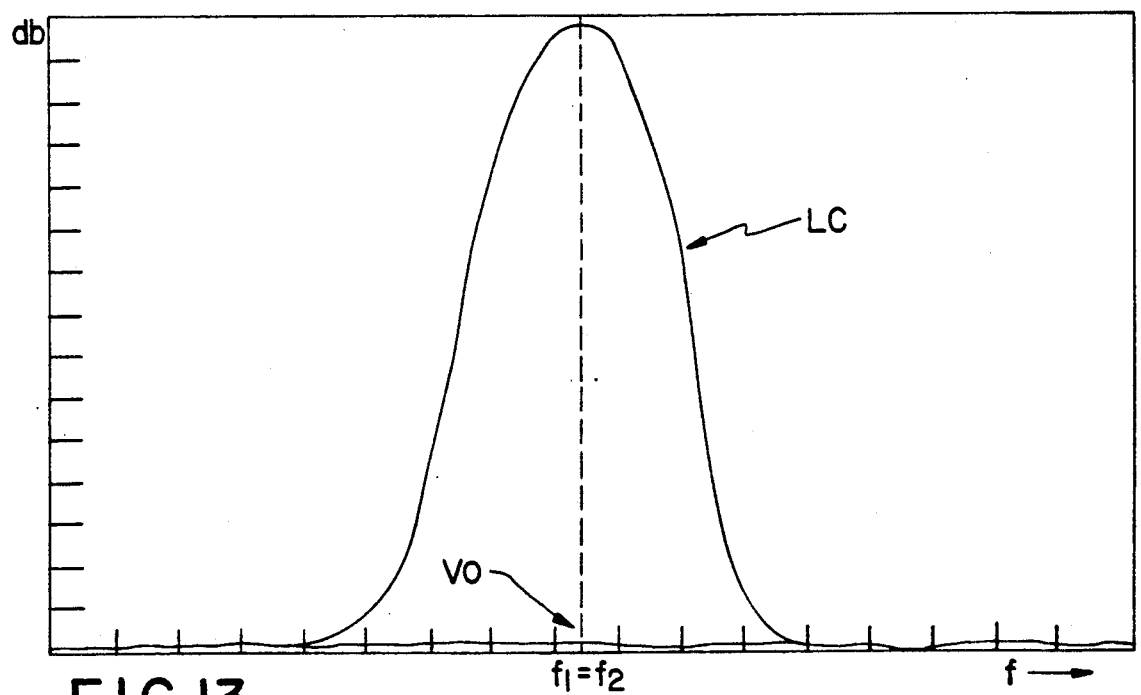
FIG. 13 shows the cancellation effect which is produced in the basic circuit shown in FIG. 3 when the resonant networks LC, coupled to the branches of the former, are identical and resonate at the same frequency.

FIG. 12 shows the amplitude/frequency characteristics of the resonant circuit L1, C1 (shown as LC) and those of the resonant circuit as shown in FIG. 2 (shown as Vo).

Figure 3:
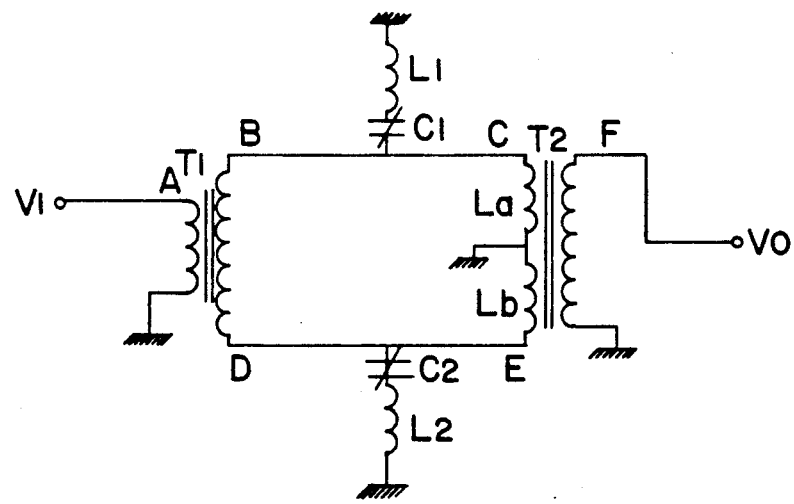
FIG. 3 represents a circuit which is in itself a part of the invention, and illustrates the combination of the three effects which are the main subject of this invention.

FIG. 3 illustrates a circuit to which a second network has been coupled, L, C in the D-E branch, formed by the coil L2 and the condenser C2. Where the resonant networks L1, C1 and L2, C2 are identical and present the same resonance for the same frequency, the balanced branches B-C and D-E produce impedance corresponding to La and Lb for the separate frequencies of this common resonance frequency, however, as these coils are identical and counterphased, the fields are cancelled and, therefore, the output at Vo is null.

It can be observed that the mutual influence between L1, C1 and L2, C2 is cancelled to a great extent by T1 and T2 and these networks do not interract, this being one of the causes that the curves of the attenuation/frequency responses are separate, without one being influenced by the other, thereby facilitating the adjustment of the device in a segment of pass or specific attenuation frequencies. In this way, one of the objections of the invention is achieved, namely, the adjustment ease.

Figure 14:
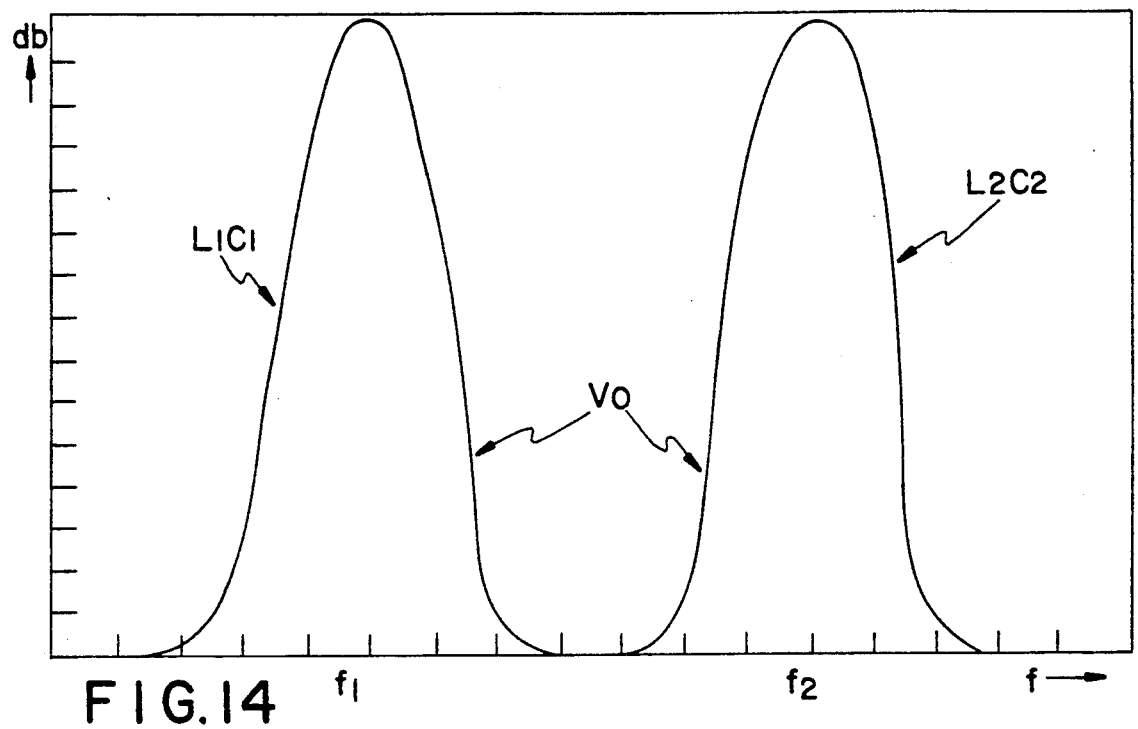
FIG. 14 shows the response resulting in the basic circuit shown in FIG. 3 when the LC networks coupled to its branches have separate resonance frequencies f1 and f2.
Figure 15:
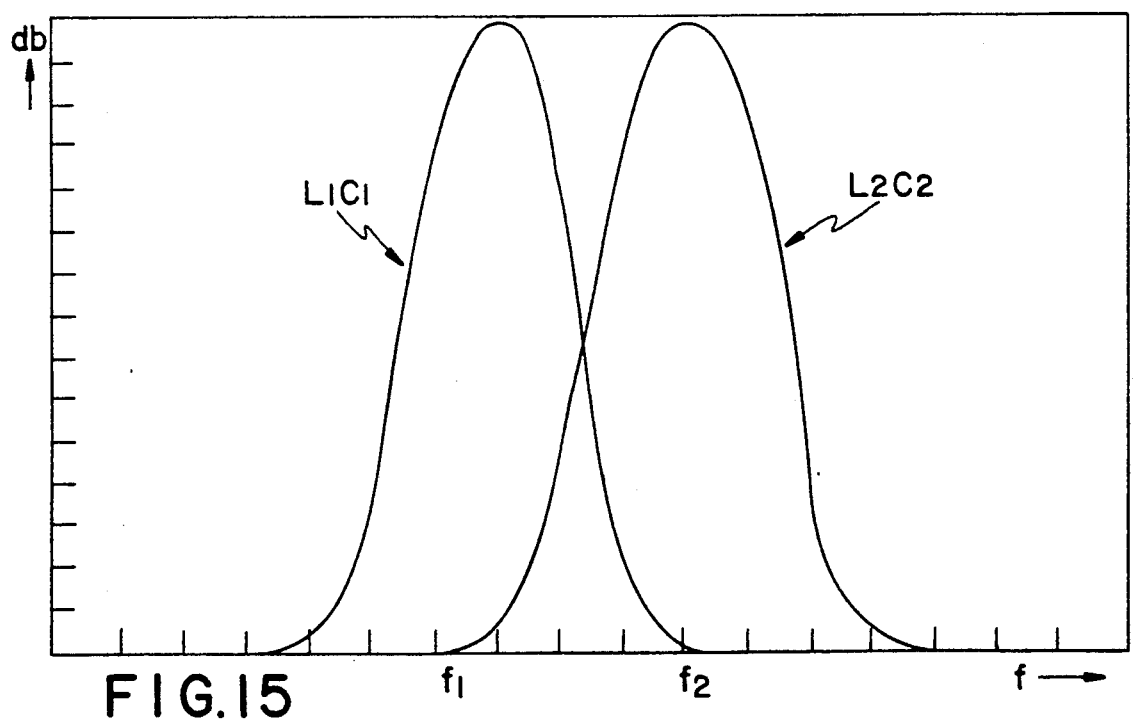
FIG. 15 shows the two separate curves with respect to the networks coupled to the branches of the basic circuit shown in FIG. 3, where the resonance frequencies f1 and f2 are close to each other, thereby producing an overlap.

If the resonance frequencies of the networks L1, C1 and L2, C2 are different, two responses are obtained at the output, corresponding to the two resonant circuits in question (see FIG. 14), however, if the frequencies are sufficiently close to each other for the separate responses to overlap, the response will be an enveloped section as shown in FIG. 15.

Figure 4:
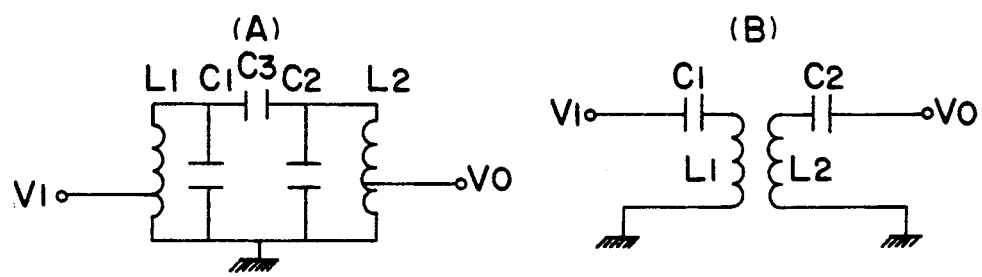
FIGS. 4A and 4B show filter circuits with two stepped tuned sections, to enable a greater understanding of the devices in question.
Figure 16:
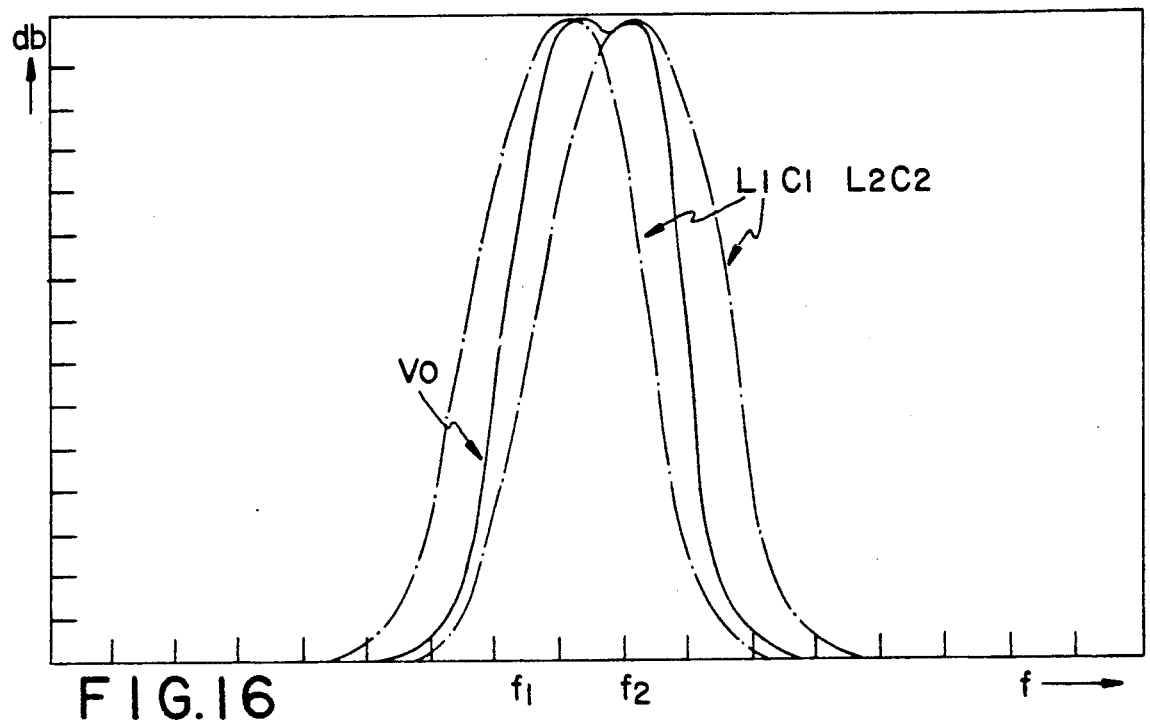
FIG. 16 shows the response resulting at Vo of the basic circuit shown in FIG. 3, when the resonance frequencies of the networks LC of each of its branches are different, but close to each other; the bandwidth and steep gradients shown in this figure demonstrate the presence of the counterphase effect.
Figure 17:
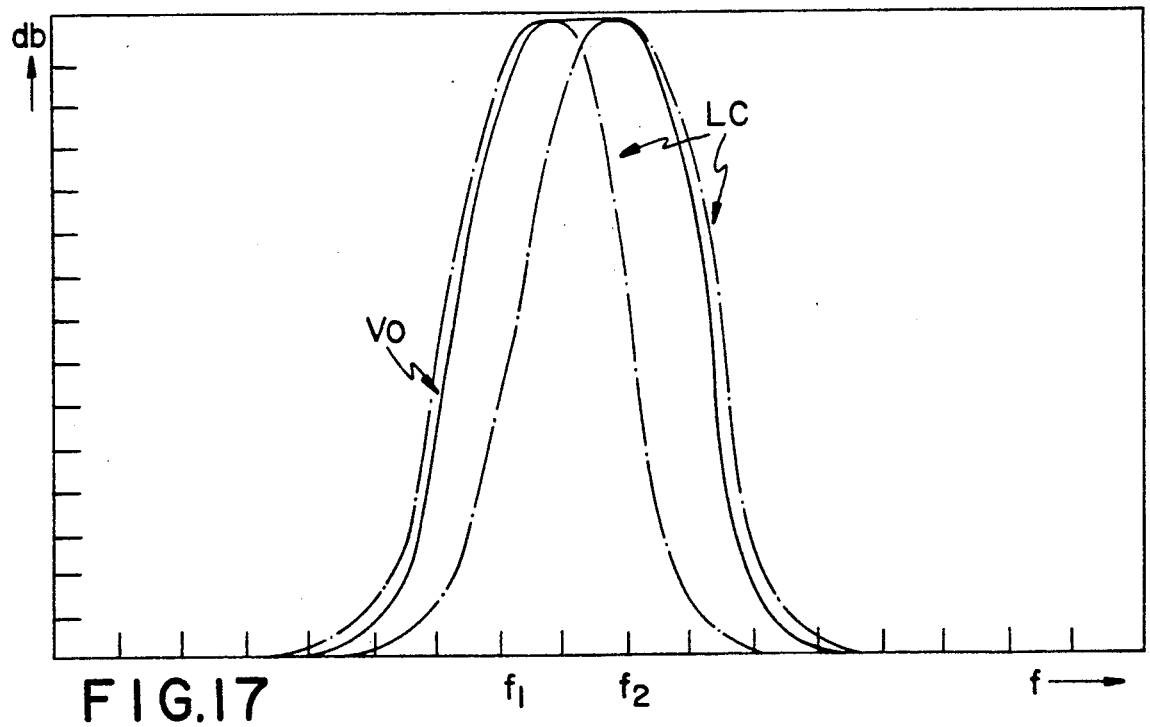
FIG. 17 shows the response resulting in a double tuned stepped circuit as shown in FIG. 4.

Although the two overlapping responses are in a state of phase opposition, the gradients of the response curves relating to amplitude/frequency are cancelled out in terms of level of penetration or overlapping of the separate amplitude/frequency responses of each of the networks L1, C1 and L2, C2 (see FIG. 16). Due to the vectorial sum of their respective transfer functions, an angle of great phase difference will be formed between the frequency of the overlapping segment, these transfer functions presenting a relative phase difference of 180 degrees, by which the modulus of the resulting transfer function is in all cases less than or equal to the modulus of any of the transfer functions of the separate L, C networks, thereby resulting in the response being greatly attenuated when the overlap is very pronounced and includes the curve edges. However, when the overlap is smaller and the edges of the response curves separate, the coverage of the resulting response of the amplitude/frequency curve becomes greater and there are very noticeable gradients due to the counterphase effect. While in a traditional double stepped tuned circuit (FIG. 4, graphs a and b) the difference in the transfer functions for frequencies close to that of resonance, form smaller phase difference angles, by which the resulting modulus is greater or equal to the modulus of any of those of the transfer functions, meaning that in this case the stronger the coupling between both resonance responses of the separate networks, the greater the resulting amplitude/frequency response, but the gradients of this response will be less noticeable (see FIG. 17). In this way the counterphase effect as used in this invention improves selectivity with respect to other traditional devices with the same coupling and attenuation capacities.

Figure 18:
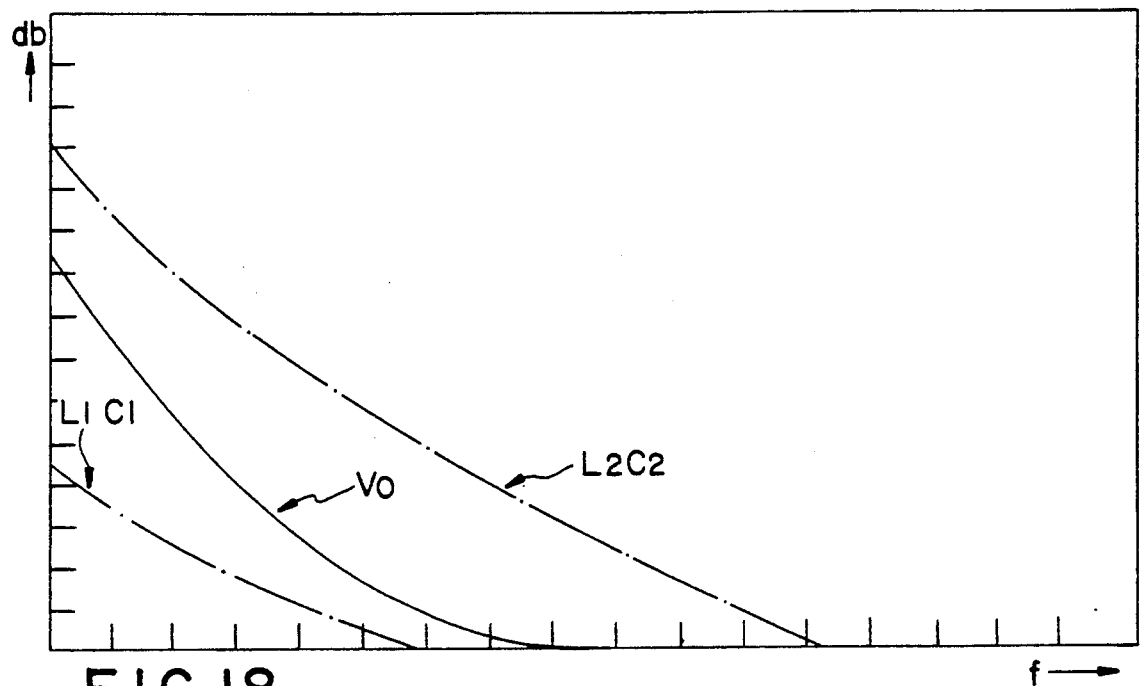
FIG. 18 shows the asymptotic section of the individual network (L1, C1 and L2, C2) responses relating to the circuit shown in FIG. 3, and the asymptotic section of the response resulting at Vo, when the resonance frequencies of the two mentioned networks are different but close to each other; the resulting response trends towards zero faster than either of the other two separate ones.

In addition, for frequencies separate from the resonance frequency of both networks and present in the asymptotic zone of the attenuation/frequency response of each of them, the difference in the transfer characteristics of these separate networks is very small, and on stimulating the transformer T2 secondary in counterphase or with a relative difference between them of 180 degrees and, since the same happens with respect to their modules which are almost identical, the result is very small or almost null and in every case moves towards zero far more quickly than in a double tuned stepped device (see FIG. 18). It is this very effect which provides the device with a greater level of protection against very high levels of interference or undesirable frequencies close to its band pass, in addition to having a high level of attenuation to frequencies outside its band pass.

As stated above, this description and the basic circuit of the device are given by way of example only and, therefore, do not in any way limit the scope of this invention.

In accordance with the stated principles of the invention, the device has been described with the two resonant networks being identical, with a slight variation in value with respect to some components, to achieve resonance at another frequency but close to the resonance frequency of the network coupled at the other branch.

Another feature of the device allows for very narrow and high gradient amplitude/frequency response curves, by coupling two or more resonant circuits LC to its branches, in this way increasing the selectivity capacity.

Figure 19:
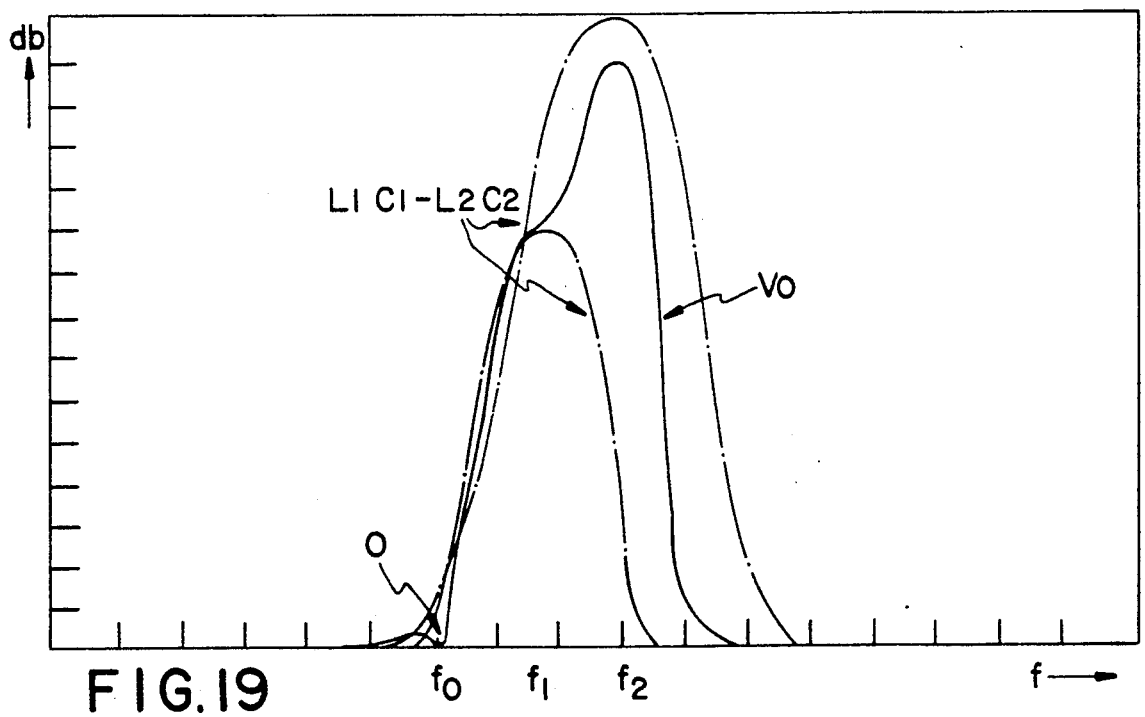
FIG. 19 shows the response resulting in the basic circuit shown in FIG. 3, when the amplitude of one of its branches is less than that of the other, thereby producing zero transmission, this in the frequency where the asymptotes of the separate LC network responses intersect, these being coupled to each of the circuit branches.

A further feature allows for zero transmission in the frequency response. In this respect, reference is made to the device having two resonant networks as shown in FIG. 3. Two methods can be followed to achieve zero transmission with respect to this device:

1. The two networks resonate at different frequencies and, therefore, there is an overlap of the respective frequency responses as shown in FIG. 15. If the level of one balanced branch varies to that of the other, the asymptotic drops of the response curves of each intersect at a zero point (see FIG. 19). At this intersection point, the modulus of the transfer function of each is identical and these are in opposition, thereby giving a zero value in the response curve at the device output.

Figure 20:
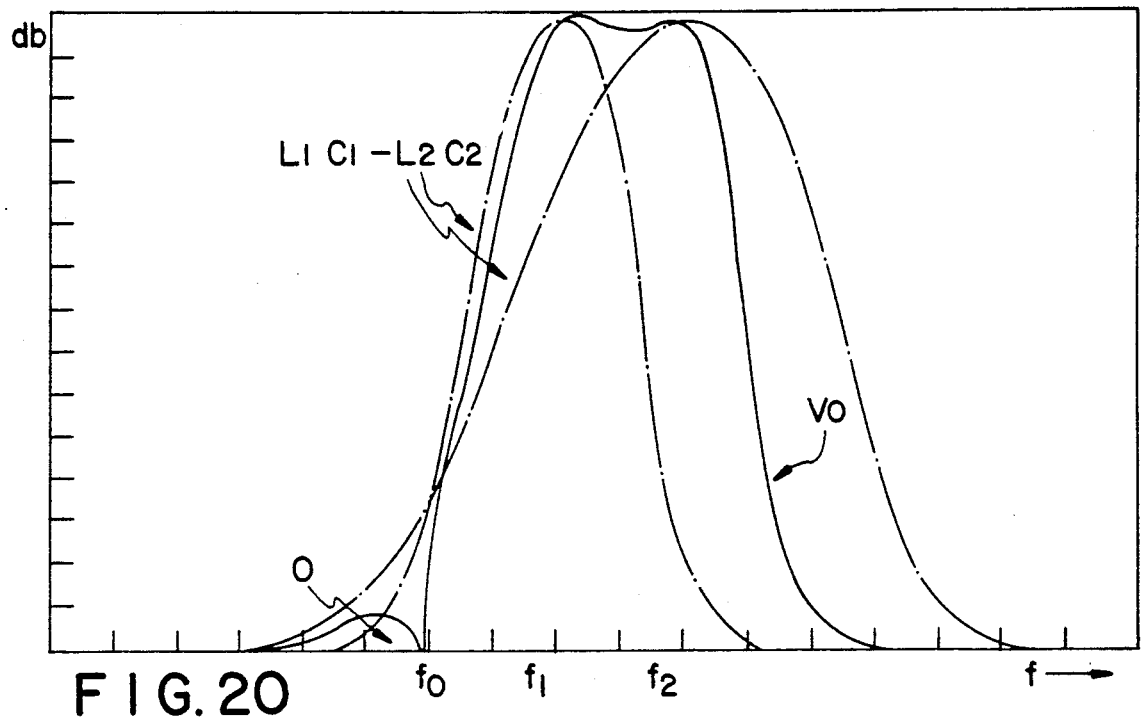
FIG. 20 shows the response resulting in the basic circuit shown in FIG. 3, when the Q values of the resonant circuits L1, L2 and C1, C2, which are coupled to each of the former's branches, are different, thereby producing zero transmission, this in the frequency where the asymptotes of the separate LC network responses intersect, these being coupled to each of the circuit branches.

2. As above, with the two resonant networks having different values with respect to the resonance frequency if the Q values of these networks are not the same, the response curves of both networks will intersect at a zero point (see FIG. 20); as explained above, zero transmission in the resulting response will be produced, on presenting the same modulus of the individual transfer function of each branch in phase opposition, giving rise to a null result with respect to the frequencies in which the mentioned intersection is produced. When a difference is combined in the Q values of the resonant networks of each branch, with a difference in amplitude between them, two intersection points are produced in their corresponding asymptotes, giving rise to the occurence of zero transmission twice in the resulting amplitude/frequency response curve.

The above feature of the invention is of particular use for a series of important applications where there is a specific requirement to attenuate a particular frequency outside the device pass band of the response, no matter how close it may be, as in the case of frequency diplexer systems.

Figure 5:
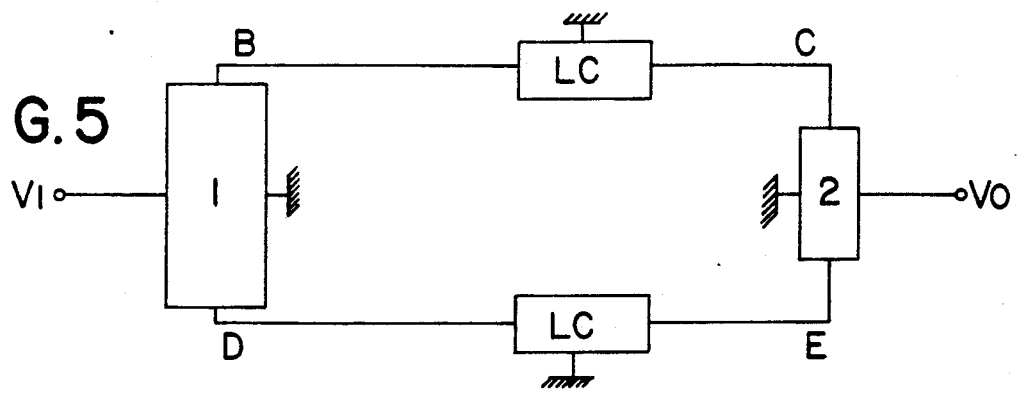
FIG. 5 shows a basic embodiment of the device.

Reference, is made to FIG. 5 as a general block diagram showing the main aspects of the filter network.

This has an input circuit (1) which transforms the impedance and symmetrises the signals (v) received by the filter, obtaining a signal at the output with a phase difference of 180° in two balanced branches BC and DE. Circuits are coupled to these balanced branches, these having impedance in accordance with the frequency LC. The signals running through the two branches are combined in a combination or confluence circuit (2), in this way obtaining the Vo signal at the output.

Figure 6:
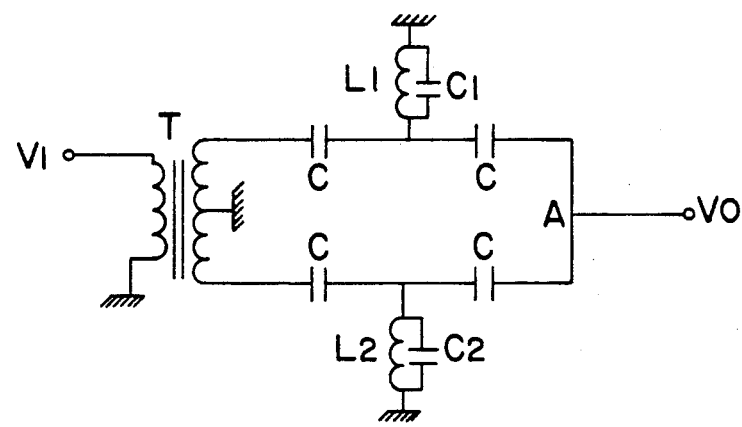
FIG. 6 shows a possible filter circuit with parallel resonant networks and high impedance couplings.

Another feature of the filter network described in this invention is as shown in FIG. 6. This shows a filter network circuit coupled in high impedance, together with parallel resonant circuits. In this device the phase difference and input signal balancing is carried out in the transformer T. The parallel networks L1, C1 and L2, C2 present specific impedance in accordance with the requency, providing for impedance which is, in theory, infinite to the resonance frequency. These signals running through both branches via C meet in counterphase at point A, producing the result at the Vo output. If the networks L1, C1 and L2, C2 have different resonance frequencies, the result will be the same as that observed in FIG. 3. The result achieved by this circuit is similar to that of a band pass filter.

Figure 7:
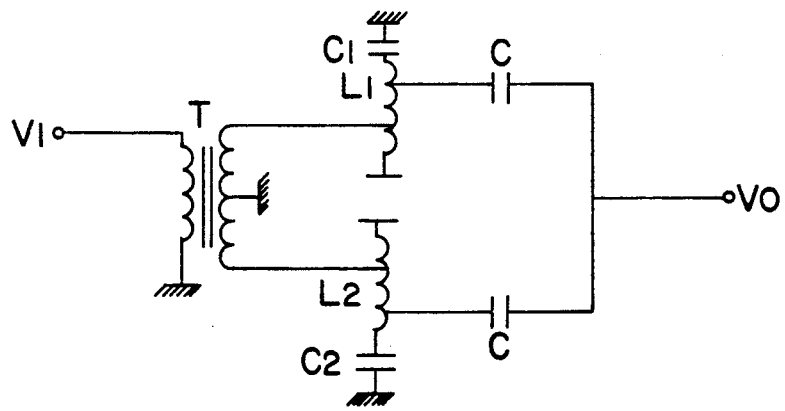
FIG. 7 shows a possible filter circuit with parallel resonant networks and low impedance couplings.

Another feature is shown in FIG. 7. This respresents a circuit coupled in low impedance, together with parallel resonant circuits. The result achieved by this circuit is similar to that of FIG. 6 and it can be used as a band pass filter. In this case the influence of the L1 and L2 coil is less than in the FIG. 6 circuit.

Figure 8:
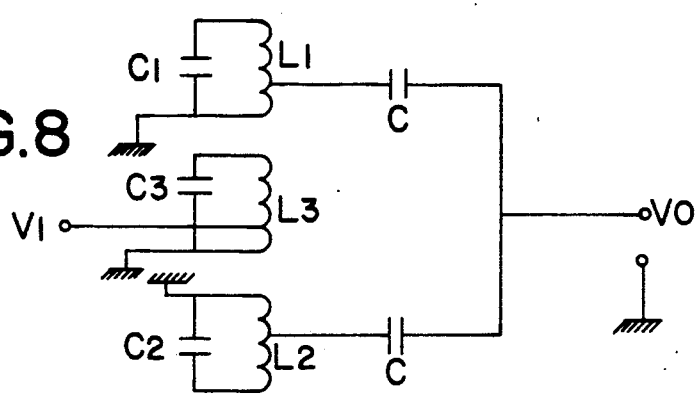
FIG. 8 shows a possible filter circuit with tuned input and parallel resonant networks coupled in low impedance.

FIG. 8 shows a further feature and, in this case, represents a network with dephased coupling to a tuned resonant circuit. The L1 and L2 coils are in counterphase. By means of this circuit, a significant improvement is observed with respect to the valley of the frequency curve response when the networks L1, C1 and L2, C2 resonate at a different frequency centered in the semi-difference of the resonance frequencies of the networks L1, C1 and L2, C2. The result achieved by this circuit is that of a band pass filter, coupling being carried out in alternation through pass condensers C.

Figure 9:
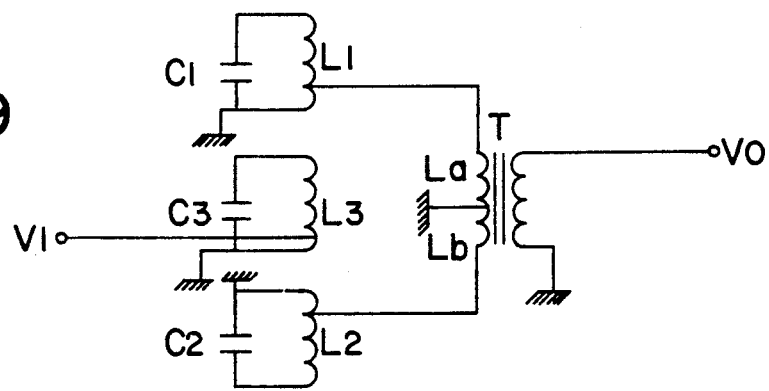
FIG. 9 shows a possible filter circuit with tuned input, parallel resonant networks and adapter output circuit by means of transformer.

Another feature is shown in FIG. 9. This circuit is similar to that of FIG. 8 and contains a network coupled by a dephasing resonant circuit and an output combiner through a transformer T. If the coils L1 and L2 are in counterphase, the coils La and Lb of the primary of the transformer T are in phase. The result achieved by this circuit is the same as that of FIG. 8, and as it represents no more than a slight variation to this latter, is similar to a band pass filter.

Figure 10:
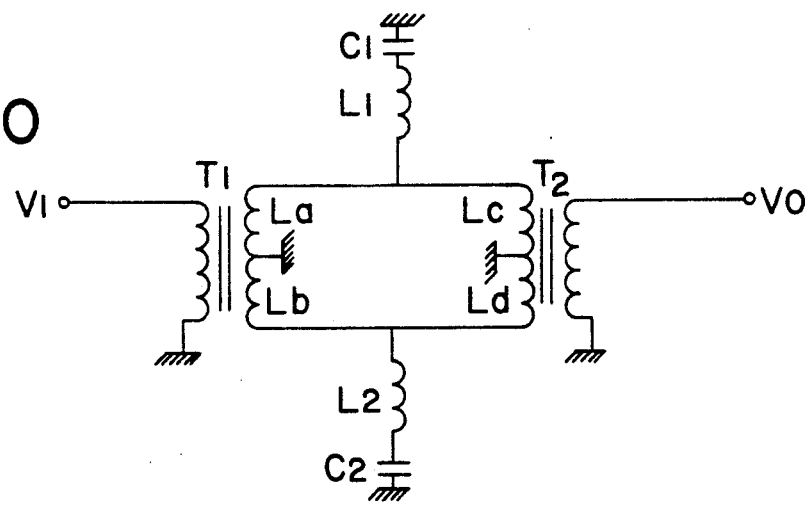
FIG. 10 shows a possible basic filter network equivalent to a band trap filter for very narrow bands.

Another feature is shown in FIG. 10. This represents a basic device and illustrates the characteristics of a narrow band trap filter. In this case the positioning of the coils La and Lb of the transformer T1 and that of the coils Lc and Ld of the transformer T2 primary give rise to the filter having a band trap facility. The networks L1, C1 and L2, C2 are resonant, in series, circuits coupled at both balanced branches. The resonance frequency of these networks will be the same or almost the same in order to achieve results similar to those of a band trap filter with a high Q value.

Figure 11:
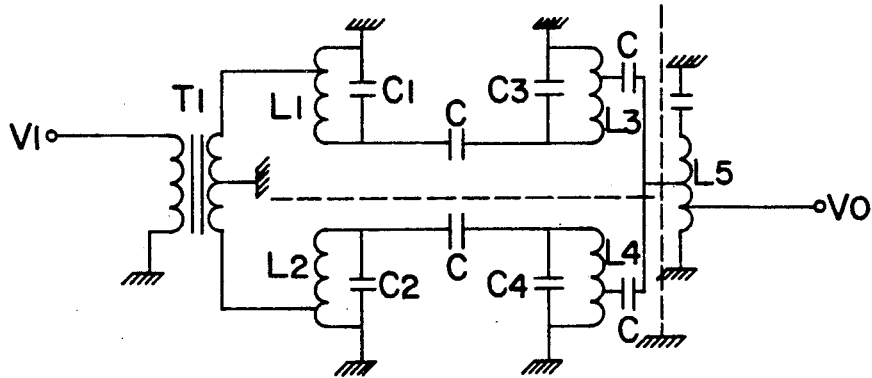
FIG. 11 shows a possible filter circuit with a dephasing transformer/adaptor at the input, a tuning network formed by parallel circuits La coupled in low impedance and tuned adapter output.
Figure 21:
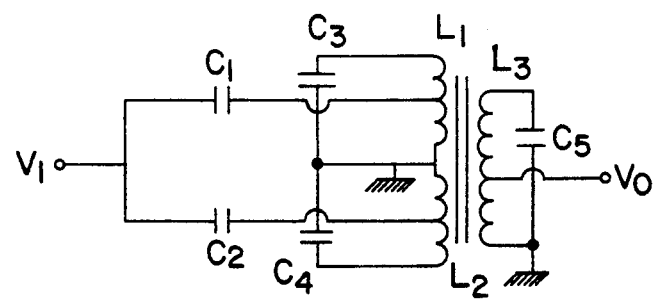
FIG. 21 shows a possible network where resonant elements have been introduced to the symmetrisation input or output.

FIG. 11 shows a further feature and represents a circuit similar to the basic one, different in that it has a double resonant circuit at each of the balanced branches L1, C1–L2, C2–L3, C3 and L4, C4. In this way a narrow band filter is obtained. It is evident that narrower bands can be obtained by increasing the number of balanced branch resonant circuits or by introducing resonant elements in the symmetrisation input or output circuits as shown in FIG. 21. It also shows a circuit whereby C1, C2 and the corresponding sections L1 and L2 form a symmetrisation input circuit, C3 and C4 resonate in L1 and L2 and comprise the impedance circuits which are variable in accordance with the frequency. At the L3 output it resonates with C5 and output is affected by a tapping process in order to improve the Q value of the circuit and its matching to the forthcoming circuit.

Lastly, it can be observed that the structure of the circuit allows it to function in both direction, i.e. V can become Vo, due to there being complete symmetry in many of the above mentioned cases.

The multiple forms and variations which the invention can assume in practice make it impossible to describe more than minimal part of these. However, it is considered that those examples described above are sufficient to give a clear indication of the nature and main objectives of the invention, while showing the effect of combining the main physical aspects. Therefore, the inclusion or omission of features which can be derived from those herein, does not in any way limit the invention. Should they be based on the same principles, they are considered to be included, in their entirety, within the scope of the disclosure.

We claim:

1. A highly frequency selective bandpass filter network for electrical signals comprising:
   an input circuit for receiving said signals, said input circuit including a transformer to modify impedance from asymmetric to balanced symmetric and produce a relative dephasing of said signals of 180 degrees at balanced secondary outputs;
   a coupled output, said coupled output delivering filtered signals to a load;
   two branches, connected in parallel between said balanced secondary outputs of said transformer and said coupled output;
   a resonant series LC circuit connected between each of the branches in parallel and a reference level,
   said series resonant LC circuits being tuned to different frequencies such that their amplitude-frequency responses overlap in such manner that an ascending slope of one resonant circuit response curve and a descending slope of the response curve of the other said resonant circuit are close to each other at a predetermined frequency spacing.

2. A filter network, according to claim 1, wherein said series resonant LC circuits are connected as arms, in each branch and are tuned at different frequencies such that their amplitude-frequency responses overlap, wherein said ascending slope of the amplitude-frequency response is of a first series LC resonant circuit tuned to a lower frequency in one of the branches, and is at a predetermined frequency gap to an ascending slope of the amplitude-frequency response of said other series resonant circuit being tuned to a higher frequency in said other branch.

3. A filter network according to claim 2, in which the slopes of the amplitude-frequency response at said output are more noticeable as the overlap increases.

4. A filter network according to claim 2, in which the bandwidth of the amplitude-frequency response at a filtering network output is determined by the separation between tuning frequencies of said series LC resonant circuits in each of said branches.

5. A filter network, according to claim 2, wherein Q values of said series LC resonant circuits connected in each of the branches, are calculated to obtain an amplitude value of the amplitude-frequency response resulting at said filter output in the intersection point of the transference maximums of the amplitude-frequency response of each of the series LC resonant circuits, equal to the one that presents the maximum of transference inside the filter pass band for a predefined bandpass.

6. A filter network, according to claim 2, in which the different Q values in each of the series LC resonant circuits connected in the branches, are predefined, in order to achieve zero transmission out of the pass band at predetermined frequencies in the amplitude-frequency response of said filter output.

7. A highly frequency selective bandpass filter network for electrical signals comprising:
an input circuit for receiving said signals, said input circuit including a transformer to modify impedance from asymmetric to balanced symmetric, and produce a relative dephasing of said signals of 180 degrees at balanced secondary outputs;
a coupled output, said coupled output delivering filtered signals to a load;
two branches connected in parallel between said balanced secondary outputs of said transformer and said coupled output, and a parallel LC resonant circuit connected between each of the branches and reference level,
said parallel LC resonant circuits being tuned to different frequencies such that their amplitude-frequency responses overlap in such a way that an ascending slope of one resonant circuit response curve and a descending slope of the response curve of the other said resonant circuit are close to each other at a predetermined frequency spacing.

8. A filter network, according to claim 7, wherein said parallel resonant LC circuits are connected as arms of each branch and, are tuned at different frequencies such that their amplitude-frequency responses overlap, wherein said ascending slope of the amplitude-frequency response is of a first parallel LC resonant circuit tuned to a lower frequency in one of the branches, and is at a predetermined frequency gap to an ascending slope of the amplitude-frequency response of said other parallel resonant circuit being tuned to a higher frequency in said other branch.

9. A filter network, according to claim 8, in which the slopes of the amplitude-frequency response resulting at said output are more noticeable as the overlap increases.

10. A filter network, according to claim 8, in which the bandwidth of the amplitude-frequency response at a filtering network output is determined by the separation between the tuning frequencies of said parallel LC resonant circuits in each of the branches.

11. A filter network, according to claim 8, wherein Q values of said parallel LC resonant circuits connected in each of the branches, are calculated to obtain an amplitude value of the amplitude-frequency response resulting at said filter output in the intersection point of the transference maximums of the amplitude-frequency response of each of the parallel LC resonant circuits, equal to the one that presents the maximums of transference inside the filter pass band for a predefined bandpass.

12. A filter network, according to claim 8, in which the different Q values in each of the parallel LC resonant circuits connected in the branches, are predefined, in order to achieve zero transmission out of the pass band at predetermined frequencies in the amplitude-frequency response of said filter output.

13. A highly selective bandpass filter network for electrical signals comprising:
an input circuit that receives said signals, said input circuit including a tuned parallel LC circuit having at least an inductor and a capacitor;
two parallel LC resonant circuits inductively coupled to said tuned parallel input LC circuit;
an output circuit that couples induced signals on said parallel LC circuits and delivers filtered signals to a load;
wherein said parallel LC resonant circuits inductively coupled to said input circuit are tuned at different frequencies such that their amplitude-frequency responses overlap, an ascending slope of one resonant circuit response curve and a descending slope of the other resonant circuit response being close, and at a predetermined frequency spacing.

14. A filter network, according to claim 13, wherein said parallel LC circuit of the input circuit is tuned to the centered semi-difference of the resonance frequencies of the parallel LC circuits to which it inducts.

15. A filter network, according to claim 13, wherein the parallel LC resonant circuits coupled to said input circuit inductor, are tuned at different frequencies, such that their frequency-amplitude responses overlap, wherein an ascending slope of the amplitude-frequency response of one of the parallel LC resonant circuits is tuned to a lower frequency and is close and with a predetermined frequency spacing with an ascending slope of the amplitude-frequency response of the other parallel LC resonant circuit tuned to a higher frequency.

16. A filter network, according to claim 15, in which the resulting amplitude-frequency response at a filter network output presents at the overlapping sections, is steeper as the overlap increases.

17. A filter network, according to claim 15, in which the resulting bandwidth at a filter network output, is determined by the spacing of the tuning frequencies of the two parallel LC resonant circuits coupled to said inductor of said input circuit.

18. A filter network, according to claim 13, in which the Q values of the parallel LC resonant circuits coupled to the input circuit inductor, are calculated in a way that in an intersection point of the transference maximums of the amplitude-frequency response of each of the parallel LC resonant circuits, the resulting amplitude of the amplitude-frequency response at the filter output is coincident with the amplitude of response of the tuned LC input circuit at the frequencies at which the parallel LC resonant circuits coupled to the input parallel LC circuit are tuned.

19. A filter network, according to claim 13, in which different Q values are defined in each of the parallel LC resonant circuits coupled to the input circuit inductor, in order to achieve zero transmission out of the pass band at predetermined frequencies in the amplitude-frequency response resulting at the filter output.

* * * * *